(12) United States Patent
Ichikawa

(10) Patent No.: US 12,120,820 B2
(45) Date of Patent: Oct. 15, 2024

(54) ELECTRONIC DEVICE

(71) Applicant: Murata Manufacturing Co., Ltd., Nagaokakyo (JP)

(72) Inventor: Keiichi Ichikawa, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 283 days.

(21) Appl. No.: 17/849,752

(22) Filed: Jun. 27, 2022

(65) Prior Publication Data
US 2022/0330431 A1 Oct. 13, 2022

Related U.S. Application Data

(63) Continuation of application No. PCT/JP2021/001211, filed on Jan. 15, 2021.

(30) Foreign Application Priority Data

Jan. 20, 2020 (JP) .................................. 2020-006482

(51) Int. Cl.
*H05K 1/14* (2006.01)
*H05K 1/02* (2006.01)

(52) U.S. Cl.
CPC ........... *H05K 1/147* (2013.01); *H05K 1/0218* (2013.01); *H05K 2201/10098* (2013.01)

(58) Field of Classification Search
CPC ................ H05K 1/147; H05K 1/0218; H05K 2201/10098
USPC ....................................................... 361/749
See application file for complete search history.

(56) References Cited

U.S. PATENT DOCUMENTS

| 6,396,709 | B1 | 5/2002 | Schmich |
| 8,367,936 | B2* | 2/2013 | Su ........................ H05K 1/0281 174/254 |
| 2006/0109394 | A1* | 5/2006 | Miyagawa ............. H05K 3/361 349/149 |

(Continued)

FOREIGN PATENT DOCUMENTS

| JP | 5769256 U | 4/1982 |
| JP | 6146767 U | 3/1986 |

(Continued)

OTHER PUBLICATIONS

International Search Report in PCT/JP2021/001211, mailed Apr. 13, 2021, 4 pages.

(Continued)

*Primary Examiner* — Binh B Tran
(74) *Attorney, Agent, or Firm* — Keating & Bennett, LLP

(57) ABSTRACT

An electronic device includes first and second circuit boards. The second circuit board includes a first portion facing a first main surface of the first circuit board, a second portion facing a second main surface opposite to the first main surface, and a bent portion connecting the first portion and the second portion to each other. The second circuit board includes an element, signal conductors, and a first opening. The first opening is between the signal conductors when viewed in a thickness direction of the element. The first opening extends from the first portion to the second portion through the bent portion. The first portion and the second portion each include a portion not including the first opening between the signal conductors.

20 Claims, 7 Drawing Sheets

(56) References Cited

U.S. PATENT DOCUMENTS

| | | | |
|---|---|---|---|
| 2009/0173795 A1 | 7/2009 | Ochi et al. | |
| 2016/0198560 A1* | 7/2016 | Shin .................... | G02B 6/0011 |
| | | | 361/749 |
| 2018/0151951 A1 | 5/2018 | Kemoto et al. | |
| 2018/0284476 A1* | 10/2018 | Minamisawa ....... | H05K 1/0281 |

FOREIGN PATENT DOCUMENTS

| | | |
|---|---|---|
| JP | 044773 U | 1/1992 |
| JP | 2000294885 A | 10/2000 |
| JP | 2006119491 A | 5/2006 |
| WO | 2007105469 A1 | 9/2007 |
| WO | 2010150588 A1 | 12/2010 |
| WO | 2017018134 A1 | 2/2017 |

OTHER PUBLICATIONS

Written Opinion in PCT/JP2021/001211, mailed Apr. 13, 2021, 5 pages.

* cited by examiner

PLAN VIEW

CROSS-SECTIONAL VIEW TAKEN ALONG LINE D-D

CROSS-SECTIONAL VIEW TAKEN ALONG LINE C-C

CROSS-SECTIONAL VIEW TAKEN ALONG LINE E-E

ELECTRONIC DEVICE

CROSS REFERENCE TO RELATED APPLICATIONS

This application claims the benefit of priority to Japanese Patent Application No. 2020-006482 filed on Jan. 20, 2020 and is a Continuation Application of PCT Application No. PCT/JP2021/001211 filed on Jan. 15, 2021. The entire contents of each application are hereby incorporated herein by reference.

BACKGROUND OF THE INVENTION

1. Field of the Invention

The present invention relates to a first circuit board and a second circuit board including a bent portion and connected to the first circuit board.

2. Description of the Related Art

International Publication No. 2017/018134 describes a structure including a multilayer substrate and a circuit board, wherein the multilayer substrate is connected to the circuit board. A first end of the multilayer substrate in a longitudinal direction is connected to a first main surface of the circuit board, and a second end of the multilayer substrate in the longitudinal direction is connected to a second main surface of the circuit board opposite to the first main surface. Thus, the multilayer substrate is connected to the circuit board while being bent.

Multiple wiring patterns are disposed on the multilayer substrate. The multiple wiring patterns are formed from linear conductors, extend in the longitudinal direction, and are arranged side by side in a lateral direction orthogonal to the longitudinal direction.

However, when the multiple wiring patterns formed from conductors are disposed on the multilayer substrate, the multilayer substrate is neither easily bent to be folded back nor easily connected to the circuit board.

SUMMARY OF THE INVENTION

Preferred embodiments of the present invention provide circuit boards, each including multiple wiring patterns and being easily bendable to be folded back.

An electronic device according to a preferred embodiment of the present invention includes a first circuit board and a second circuit board. The first circuit board includes a first main surface and a second main surface that are opposite to each other. The second circuit board includes a first portion that faces the first main surface, a second portion that faces the second main surface, and a bent portion that connects the first portion and the second portion to each other. The second circuit board includes a portion that defines the first portion, the bent portion, and the second portion and that has insulating properties, a plurality of signal conductors, and a first opening. The plurality of signal conductors are located in the portion, extend in a first direction in which the first portion, the bent portion, and the second portion are connected to each other, and are spaced apart from each other in a second direction orthogonal or substantially orthogonal to the first direction. The first opening is between the plurality of signal conductors when viewed in a thickness direction of the portion. The first opening extends from at least one of the first portion or the second portion to the bent portion. The first portion and the second portion each include a portion not including the first opening between the plurality of signal conductors.

In this structure, the first opening extends from the bent portion to at least one of the first portion or the second portion. Thus, the portion extending from the bent portion to at least one of the first portion or the second portion is easily bendable. This structure facilitates bending of the second circuit board at a portion around an end portion of at least one of the first main surface or the second main surface of the first circuit board. Thus, the second circuit board is more reliably bendable than in a structure where the first opening is simply provided in the bent portion, and is thus more easily provided along at least one of the first main surface or the second main surface of the first circuit board.

The first portion and the second portion of the second circuit board each include a portion not including the first opening. Thus, the first portion and the second portion are less easily deformed. Thus, the second circuit board can be easily provided on the first circuit board to satisfy a desired positional relationship between the second circuit board and the first circuit board.

Preferred embodiments of the present invention each facilitate bending of a circuit board including multiple wiring patterns to fold back the circuit board.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described below with reference to the drawings.

First Preferred Embodiment

Figure 1A:
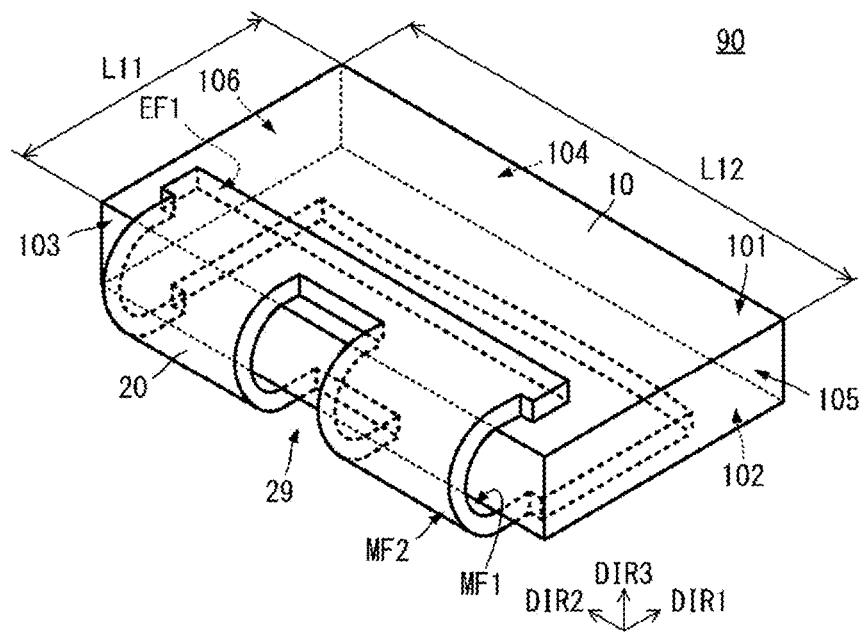
FIG. 1A is a perspective view of an electronic device according to a first preferred embodiment of the present invention.
Figure 1B:
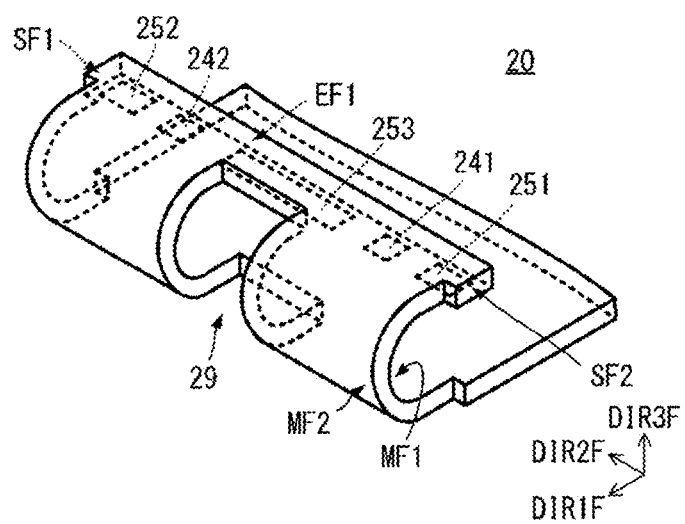
FIG. 1B is a perspective view of a second circuit board according to the first preferred embodiment of the present invention.
Figure 2A:
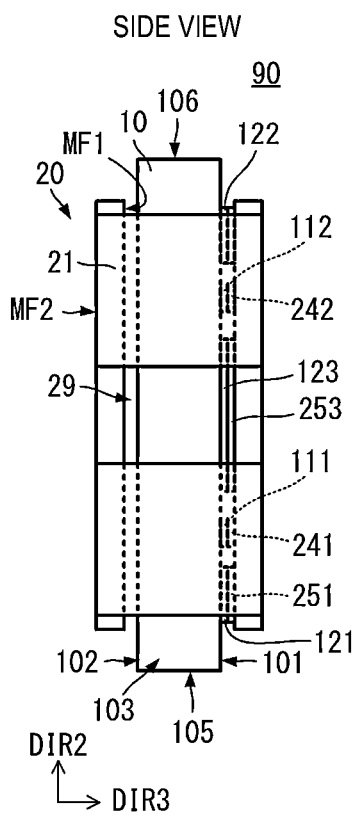
FIG. 2A is a side view of the electronic device according to the first preferred embodiment of the present invention.
Figure 2B:
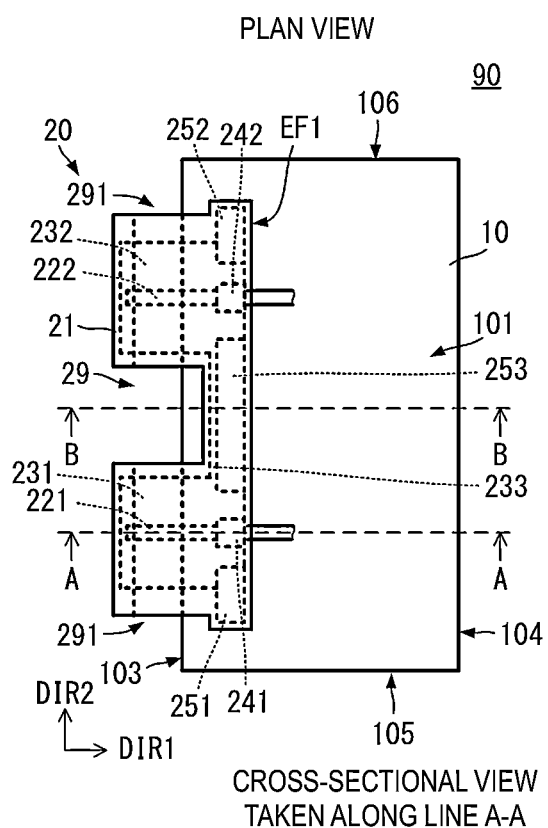
FIG. 2B is a plan view of the electronic device according to the first preferred embodiment of the present invention.
Figure 2C:
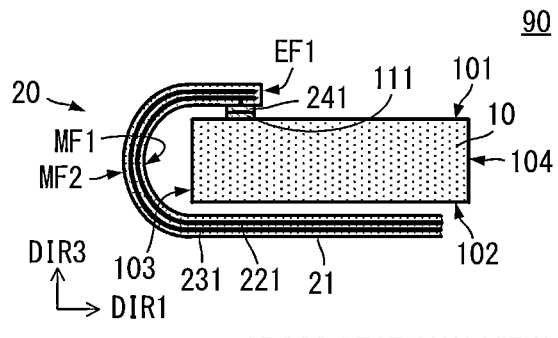
FIG. 2C is a cross-sectional view of the electronic device according to the first preferred embodiment of the present invention taken along line A-A.
Figure 2D:
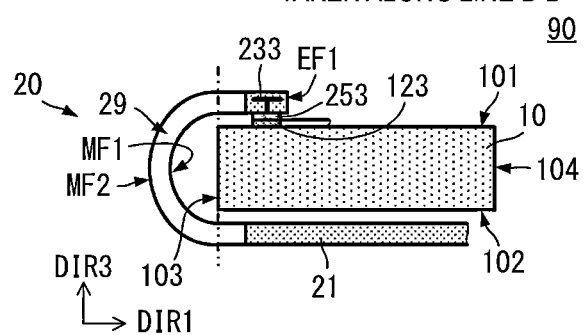
FIG. 2D is a cross-sectional view of the electronic device according to the first preferred embodiment of the present invention taken along line B-B.
Figure 3A:
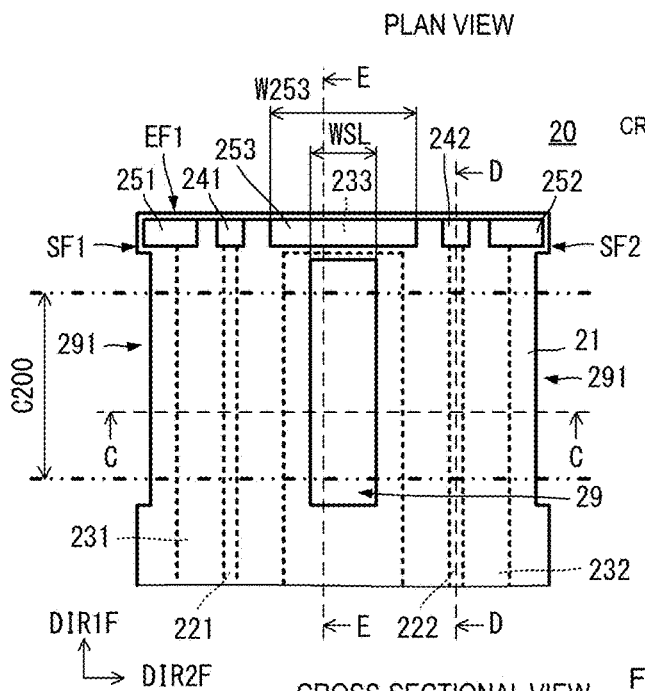
FIG. 3A is a plan view of a second circuit board according to the first preferred embodiment of the present invention.
Figure 3C:
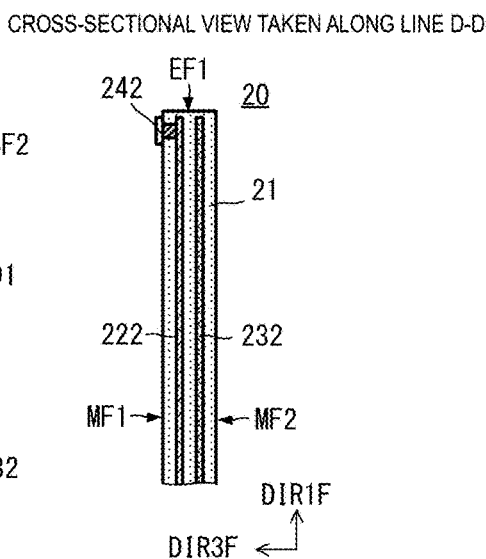
FIG. 3C is a cross-sectional view of the second circuit board according to the first preferred embodiment taken along line D-D.
Figure 3B:
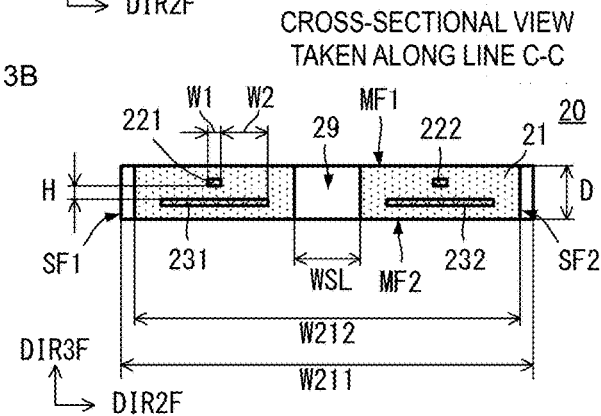
FIG. 3B is a cross-sectional view of the second circuit board according to the first preferred embodiment of the present invention taken along line C-C.
Figure 3D:
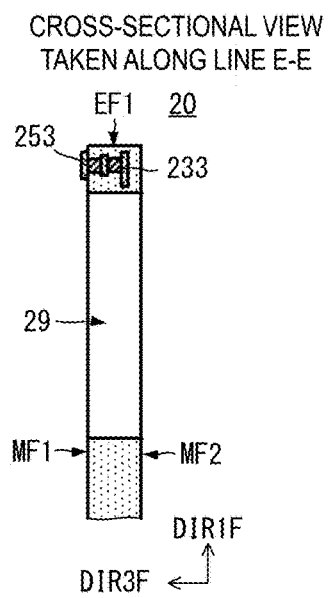
FIG. 3D is a cross-sectional view of the second circuit board according to the first preferred embodiment of the present invention taken along line E-E.
Figure 4A:
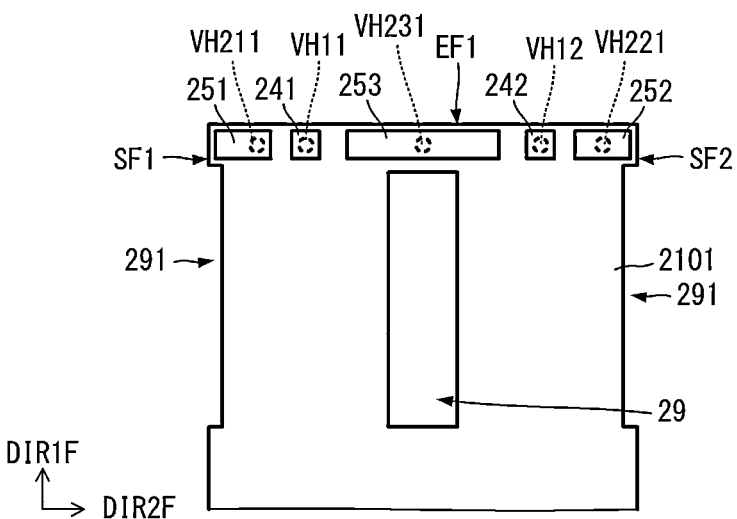
FIGS. 4A to 4C are exploded plan views of the second circuit board according to the first preferred embodiment of the present invention.
Figure 4B:
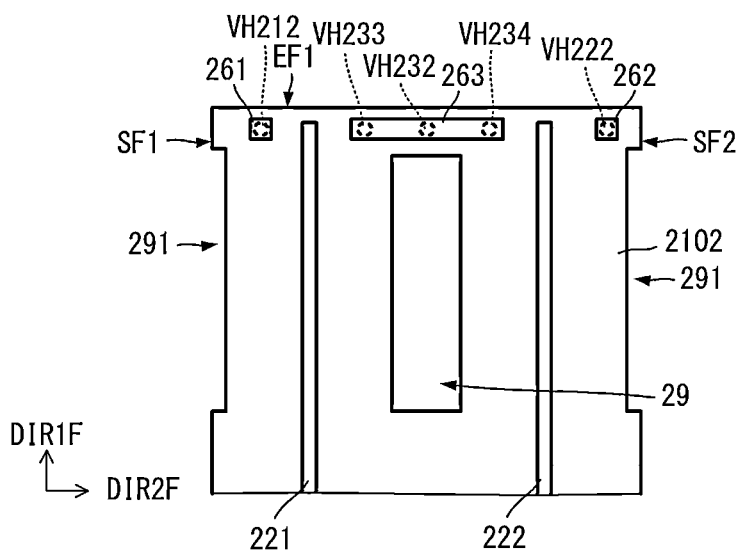
Figure 4C:
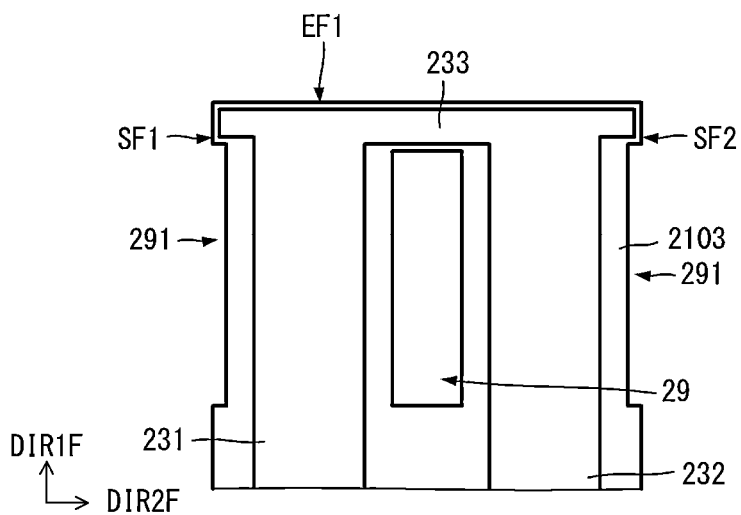

An electronic device according to a first preferred embodiment of the present invention will be described with reference to the drawings. FIG. 1A is a perspective view of the electronic device according to the first preferred embodiment, and FIG. 1B is a perspective view of a second circuit board according to the first preferred embodiment. FIG. 2A is a side view of the electronic device according to the first preferred embodiment, FIG. 2B is a plan view of the electronic device according to the first preferred embodiment, FIG. 2C is a cross-sectional view of the electronic device according to the first preferred embodiment taken along line A-A, and FIG. 2D is a cross-sectional view of the electronic device according to the first preferred embodiment taken along line B-B. FIG. 3A is a plan view of the second circuit board according to the first preferred embodiment, FIG. 3B is a cross-sectional view of the second circuit board according to the first preferred embodiment taken along line C-C, FIG. 3C is a cross-sectional view of the second circuit board according to the first preferred embodiment taken along line D-D, and FIG. 3D is a cross-sectional view of the second circuit board according to the first preferred embodiment taken along line E-E. FIGS. 4A to 4C are exploded plan views of the second circuit board according to the first preferred embodiment. Throughout the drawings, the second circuit board is partially illustrated. Throughout the drawings, some of dimensions including a thickness are exaggerated as appropriate for visibility. Throughout the drawings, some of the reference signs clearly illustrated in other drawings are omitted.

As illustrated in FIGS. 1A and 2A to 2D, an electronic device 90 according to the first preferred embodiment includes a first circuit board 10 and a second circuit board 20.

Structure of First Circuit Board 10

The first circuit board 10 is planar, and includes a main surface 101, a main surface 102, a side surface 103, a side surface 104, a side surface 105, and a side surface 106. The main surfaces 101 and 102 are opposite to each other, the side surfaces 103 and 104 are opposite to each other, and the side surfaces 105 and 106 are opposite to each other.

The main surfaces 101 and 102 are parallel or substantially parallel to a first direction DIR1 and a second direction DIR2 in the electronic device 90, and spaced apart from each other in a third direction DIR3. The distance between the main surfaces 101 and 102 in the third direction DIR3 corresponds to the thickness of the first circuit board 10. The main surface 101 corresponds to "a first main surface," and the main surface 102 corresponds to "a second main surface."

The side surfaces 103 and 104 are parallel or substantially parallel to the second direction DIR2 and the third direction DIR3 in the electronic device 90, and spaced apart from each other in the first direction DIR1. The distance between the side surfaces 103 and 104 in the first direction DIR1 corresponds to a first-direction length L11 of the first circuit board 10.

The side surfaces 105 and 106 are parallel or substantially parallel to the first direction DIR1 and the third direction DIR3 in the electronic device 90, and spaced apart from each other in the second direction DIR2. The distance between the side surfaces 105 and 106 in the second direction DIR2 corresponds to a second-direction length L12 of the first circuit board 10.

The first-direction length L11 is smaller than the second-direction length L12. In other words, the second-direction length L12 is larger than the first-direction length L11. The first-direction length L11 and the second-direction length L12 are larger than the thickness.

The first circuit board 10 includes a material having insulating properties. The material of the first circuit board 10 is, for example, a glass epoxy resin, and has a relative permittivity $\varepsilon 1$ and a dielectric loss tangent $\delta 1$.

As illustrated in FIGS. 2A to 2D, the first circuit board 10 includes, on the main surface 101, a land conductor 111, a land conductor 112, a land conductor 121, a land conductor 122, and a land conductor 123. These land conductors are located on the main surface 101 at, for example, positions closer to the side surface 103 than to the side surface 104, or more specifically, adjacent to or in a vicinity of the side surface 103. These land conductors are arranged from a portion adjacent to or in a vicinity of the side surface 105 toward a portion adjacent to or in a vicinity of the side surface 106 in the second direction DIR2 in order of the land conductors 121, 111, 123, 112, and 122.

Although not illustrated, multiple planar antenna conductors are disposed on the main surface 101. The multiple antenna conductors are arranged, for example, in the second direction DIR2. The multiple antenna conductors are respectively connected to the land conductors 111 and 112. The land conductors 121, 122, and 123 are connected to a ground conductor of the first circuit board 10 not illustrated.

Structure of Second Circuit Board 20

As illustrated in FIGS. 3A to 3D, the second circuit board 20 has a flat film shape, and includes a main surface MF1, a main surface MF2, an end surface EF1, a side surface SF1, and a side surface SF2. The main surfaces MF1 and MF2 are opposite to each other, and the side surfaces SF1 and SF2 are opposite to each other. The end surface EF1 is orthogonal or substantially orthogonal to the main surfaces MF1 and MF2 and the side surfaces SF1 and SF2.

The main surfaces MF1 and MF2 are parallel or substantially parallel to a first direction DIR1F and the second direction DIR2F in the second circuit board 20, and spaced apart from each other in the third direction DIR3F. The distance between the main surfaces MF1 and MF2 in the third direction DIR3F corresponds to a thickness D of the second circuit board 20.

The side surfaces SF1 and SF2 are parallel or substantially parallel to the first direction DIR1F and the third direction DIR3F in the second circuit board 20, and spaced apart from each other in the second direction DIR2F. The distance between the side surfaces SF1 and SF2 in the second direction DIR2F corresponds to a width (second-direction length) W211 of the second circuit board 20.

The end surface EF1 is parallel or substantially parallel to the second direction DIR2F and the third direction DIR3F in the second circuit board 20, and orthogonal or substantially orthogonal to the first direction DIR1F. The first-direction length of the second circuit board 20 is larger than the width W211. The thickness D of the second circuit board 20 is smaller than the first-direction length and the width W211 of the second circuit board 20, or more specifically, smaller than or equal to about one-tenth of the first-direction length and the width W211.

A portion of the second circuit board 20 not illustrated (a portion opposite to the end surface EF1) has a structure according to the specifications of the second circuit board 20. For example, a predetermined circuit provided from, for example, a conductor pattern may be disposed at the portion, or an electronic component may be mounted at the portion.

The second circuit board 20 includes a portion 21 with a flat film shape. The portion 21 has a relative permittivity $\varepsilon 2$ and a dielectric loss tangent $\delta 2$. The relative permittivity $\varepsilon 2$ is smaller than the relative permittivity $\varepsilon 1$, and the dielectric loss tangent $\delta 2$ is smaller than the dielectric loss tangent $\delta 1$. Thus, the second circuit board 20 can more effectively reduce a transmission loss of high-frequency signals than the first circuit board 10.

The second circuit board 20 includes a signal conductor 221, a signal conductor 222, a ground conductor 231, a ground conductor 232, a ground conductor 233, an external connection conductor 241, an external connection conductor 242, an external connection conductor 251, an external connection conductor 252, an external connection conductor 253, and a first opening 29.

The signal conductors 221 and 222 are disposed at central positions in a thickness direction (third direction DIR3F) in the portion 21. The thickness direction in this case indicates a direction in which the main surfaces MF1 and MF2 are arranged in parallel or substantially in parallel when viewed in the third direction DIR3F. The signal conductors 221 and 222 linearly extend in the first direction DIR1F in the second circuit board 20 side by side in parallel or substantially in parallel. The signal conductors 221 and 222 have a width (length in the second direction DIR2F) W1. The signal conductors 221 and 222 are spaced apart from each other in the second direction DIR2F of the second circuit board 20. First ends of the signal conductors 221 and 222 in the longitudinal direction are located adjacent to or in a vicinity of the end surface EF1 of the second circuit board 20. Instead of extending in the first direction DIR1F throughout, the signal conductors 221 and 222 may be partially bent. The signal conductors 221 and 222 may roughly extend in the first direction DIR1F as a whole when viewed schematically.

The ground conductors 231 and 232 are disposed at central positions in the thickness direction (third direction DIR3F) of the portion 21. The ground conductors 231 and 232 have a flat film shape. The width (length in the second direction DIR2F) of the ground conductor 231 and the width (length in the second direction DIR2F) of the ground conductor 232 are larger than the width (length in the second direction DIR2F) W1 of the signal conductor 221 and the width (length in the second direction DIR2F) W1 of the signal conductor 222. The ground conductor 231 faces the signal conductor 221 and extends in parallel or substantially in parallel to the signal conductor 221. The ground conductor 232 faces the signal conductor 222 and extends in parallel or substantially in parallel to the signal conductor 222.

The ground conductor 231 is located closer to the main surface MF2 than the signal conductor 221. The ground conductor 232 is located closer to the main surface MF2 than the signal conductor 222. The ground conductor 231 and the signal conductor 221 are spaced apart from each other by a distance (interval) H in the thickness direction (third direction DIR3F) of the second circuit board 20. The ground conductor 232 and the signal conductor 222 are spaced apart from each other by a distance (interval) H in the thickness direction (third direction DIR3F) of the second circuit board 20. Thus, the second circuit board 20 includes a first strip line including the signal conductor 221 and the ground conductor 231, and a second strip line including the signal conductor 222 and the ground conductor 232. Specifically, the second circuit board 20 includes a multiconductor transmission line.

The first ends of the ground conductors 231 and 232 in the longitudinal direction are located adjacent to or in a vicinity of the end surface EF1 of the second circuit board 20.

The ground conductor 233 is disposed at a central position of the portion 21 in the thickness direction (third direction DIR3F). The ground conductor 233 is disposed at the same or substantially the same position as the positions of the ground conductors 231 and 232. The ground conductor 233 is disposed adjacent to or in a vicinity of the end surface EF1 of the second circuit board 20. The ground conductor 233 has a flat film shape, and connects the ground conductors 231 and 232 to each other.

The external connection conductors 241, 242, 251, 252, and 253 are rectangular or substantially rectangular conductor patterns when viewed in a plan. The external connection conductors 241, 242, 251, 252, and 253 are disposed on the main surface MF1 at positions adjacent to or in a vicinity of the end surface EF1. These external connection conductors are arranged from portions adjacent to or in a vicinity of the side surface SF1 toward portions adjacent to or in a vicinity of the side surface SF2 in the second direction DIR2F in order of the external connection conductors 251, 241, 253, 242, and 252.

As illustrated in FIGS. 4A to 4D, the external connection conductor 241 is connected to the signal conductor 221 through a via conductor VH11. The external connection conductor 242 is connected to the signal conductor 222 through a via conductor VH12. The external connection conductor 251 is connected to the ground conductor 231 through a via conductor VH211, an auxiliary conductor 261, and a via conductor VH212. The external connection conductor 252 is connected to the ground conductor 232 through a via conductor VH221, an auxiliary conductor 262, and a via conductor VH222. The external connection conductor 253 is connected to the ground conductor 233 through a via conductor VH231, an auxiliary conductor 263, a via conductor VH232, a via conductor VH233, and a via conductor VH234.

The first opening 29 extends through the portion 21 of the second circuit board 20 in the thickness direction (third direction DIR3F). The first opening 29 has predetermined dimensions in the first direction DIR1F and the second direction DIR2F, and is rectangular when viewed in a plan.

The first opening 29 is disposed between, in the second direction DIR2F, an area where the signal conductor 221 and the ground conductor 231 are disposed and an area where the signal conductor 222 and the ground conductor 232 are disposed. The first opening 29 does not extend to the end surface EF1. In other words, the portion 21 is present between the end surface EF1 of the second circuit board 20 and the first opening 29 in the first direction DIR1F. The ground conductor 233 and the external connection conductor 253 are disposed at this portion of the portion 21.

The second circuit board 20 with the above-described shape is, for example, formed as follows. An insulator layer 2101, an insulator layer 2102, and an insulator layer 2103 are formed from, for example, a thermoplastic resin containing a liquid crystal polymer as a main material.

The external connection conductors 241, 242, 251, 252, and 253 are disposed on the insulator layer 2101, and the via conductors VH11, VH12, VH211, VH221, and VH231 are disposed in the insulator layer 2101. The signal conductors 221 and 222 are disposed on the insulator layer 2102, and the auxiliary conductors 261, 262, and 263 and the via conductors VH212, VH222, VH232, VH233, and VH234 are disposed on or in the insulator layer 2102. The ground conductors 231, 232, and 233 are disposed on the insulator layer 2103.

The insulator layers 2101, 2102, and 2103 are laminated on each other and undergo thermal pressure bonding. Thus, a multilayer body defining and functioning as the base of the second circuit board 20 is formed. The first opening 29 is formed by, for example, partially punching out the multilayer body. The first opening 29 may be formed in the insulator layers 2101, 2102, and 2103 in the state where the insulator layers 2101, 2102, and 2103 are separate. Thus, the second circuit board 20 is formed.

The planar second circuit board 20 is held with, for example, a die assembly, heated, and then plastically deformed. Thus, as illustrated in FIG. 1B, the second circuit board 20 can have a configuration (bifold structure) of being bent to fold back at a central position in the longitudinal direction. The second circuit board 20 that is plastically deformed can retain the bifold structure. The bifold structure in this case indicates a bent structure where a first portion and a second portion, described later, overlap each other when viewed in the third direction DIR3F.

In this case, the second circuit board 20 is bent so that the portion of the second circuit board 20 including the first opening 29 in the first direction DIR1F includes the bent portion (for example, a portion corresponding to an area C200 illustrated in FIG. 3A). This process of bending the portion including the first opening 29 is performed more easily than in the case of bending the portion not including the first opening 29. This structure thus facilitates forming the bent portion in the second circuit board 20.

Particularly, in the electronic device 90 according to the present preferred embodiment, as will be described later, the first opening 29 extends from a flat or substantially flat first portion (a portion that is to face the main surface 101 of the first circuit board 10) continuous with the bent portion to a flat or substantially flat second portion (a portion that is to face the main surface 102 of the first circuit board 10) continuous with the bent portion. The first opening 29 continuously extends between both ends of the bent portion in the first direction DIR1F. This structure facilitates forming of the bent portion in the second circuit board 20.

The bifold structure may be provided while the insulator layers 2101, 2102, and 2103 are laminated and undergo thermal pressure bonding. In this case, the first opening 29 may be provided in the insulator layers 2101, 2102, and 2103 in the state where the insulator layers 2101, 2102, and 2103 are separate.

Connection Structure between First Circuit Board 10 and Second Circuit Board 20

As illustrated in FIGS. 1A and 2A to 2D, the second circuit board 20 is disposed to hold the first circuit board 10 in the thickness direction. At this time, the first direction DIR1F of the second circuit board 20 is parallel or substantially parallel to the first direction DIR1 of the first circuit board 10. The second direction DIR2F of the second circuit board 20 is parallel or substantially parallel to the second direction DIR2 of the first circuit board 10.

A flat portion located near the end surface EF1 faces the main surface 101 of the first circuit board 10. This portion facing the main surface 101 corresponds to "a first portion." A flat portion located spaced away from the end surface EF1 with the bent portion interposed therebetween corresponds to the main surface 102 of the first circuit board 10. This portion facing the main surface 102 corresponds to "a second portion." The bent portion between the first portion and the second portion is located on the outer side of the side surface 103 of the first circuit board 10.

The main surface MF1 of the second circuit board 20 faces the first circuit board.

The external connection conductor 241 of the second circuit board 20 is connected to the land conductor 111 of the first circuit board 10, and the external connection conductor 242 of the second circuit board 20 is connected to the land conductor 112 of the first circuit board 10. The external connection conductor 251 of the second circuit board 20 is connected to the land conductor 121 of the first circuit board 10, the external connection conductor 252 of the second circuit board 20 is connected to the land conductor 122 of the first circuit board 10, and the external connection conductor 253 of the second circuit board 20 is connected to the land conductor 123 of the first circuit board 10.

To provide the electronic device 90 with the above-described structure, the second circuit board 20 with the above-described structure is easily disposed on the first circuit board and easily connected to the first circuit board 10. More specifically, as described above, the first opening 29 extending from the first portion to the second portion through the bent portion facilitates providing a bifold structure of the second circuit board 20. The second circuit board 20 thus easily formed into a predetermined shape facilitates providing the electronic device 90 where the second circuit board 20 holds the first circuit board 10 therein and the second circuit board 20 is connected to the first circuit board 10.

In the second circuit board 20, the first opening 29 is located between the signal conductors 221 and 222. This structure can reduce electromagnetic field coupling between the signal conductors 221 and 222. This structure can thus improve isolation between the first strip line including the signal conductor 221 and the ground conductor 231 and the second strip line including the signal conductor 222 and the ground conductor 232. In other words, this structure can reduce coupling between the transmission lines in a multi-conductor transmission line. Particularly, the electromagnetic field characteristics are more likely to change at the bent portion. However, the second circuit board 20 including the bent portion with the first opening 29 can reduce electromagnetic field coupling at the bent portion, and is thus more effective.

The first portion in the second circuit board 20 includes a portion not including the first opening 29. The portion including the first opening 29 can also reduce a change of the positional relationship between the portion including the signal conductor 221 and the portion including the signal conductor 222. For example, the portion including the first opening 29 can prevent the signal conductors 221 and 222 from unnecessarily approaching each other. This structure can thus stably retain the distance between the signal conductors 221 and 222 while retaining the bendability, and can reduce electromagnetic field coupling between the signal conductors 221 and 222.

In the second circuit board 20, the external connection conductors 241, 242, 251, 252, and 253 are disposed at a portion of the first portion not including the first opening 29. Thus, the positional relationship between the external connection conductors 241, 242, 251, 252, and 253 is less likely to change. Thus, the second circuit board 20 can be reliably and easily connected to the first circuit board 10.

In the above structure, in the second circuit board 20, the ground conductor 231 is disposed on the outer side of the signal conductor 221 in a curvature, and the ground conductor 232 is disposed on the outer side of the signal conductor 222 in a curvature. This structure can thus reduce unnecessary radiation of electromagnetic waves from the signal conductors 221 and 222 to the outside. This structure can also reduce noise received by the signal conductors 221 and 222 from the outside.

In the above-described structure, the ground conductor 233 is disposed at the portion of the first portion not including the first opening 29. Thus, the portion of the first portion not including the first opening 29 has higher strength, and is prevented from being broken. In this case, the length of the ground conductor 233 in the second direction DIR2F is greater than a width WSL, or the dimension of the first opening 29 in the second direction DIR2F. The ground conductor 233 protrudes outward from both ends of the first opening 29 in the second direction DIR2F. Thus, the portion of the first portion not including the first opening 29 is further prevented from being broken. The ground conductor 233 is connected (physically connected) to the ground conductors 231 and 232, and thus the portion of the first portion not including the first opening 29 is further prevented from being broken.

In the above structure, the external connection conductor 253 is disposed at the portion of the first portion not including the first opening 29. This external connection conductor 253 corresponds to "an external connection conductor between signal conductors." Thus, the portion of the first portion not including the first opening 29 improves the strength, and is prevented from being broken. At this time, a dimension W253 of the external connection conductor 253 in the second direction DIR2F is greater than the width WSL of the first opening 29. The external connection conductor 253 protrudes outward from both ends of the first opening 29 in the second direction DIR2F. Thus, the portion of the first portion not including the first opening 29 is further prevented from being broken.

As illustrated in FIGS. 1A, 1B, 2A, 2B, 3A, and 3B, the second circuit board 20 includes recesses 291 in the side surfaces SF1 and SF2 at the portion including the first opening 29 in the first direction DIR1F. Thus, a width W212 of the portion including the first opening 29 in the first direction DIR1F is smaller than the width W211 of the second circuit board 20 (a width of portions of the first portion and the second portion not including the first opening 29). This structure further facilitates forming of the bent portion in the second circuit board 20.

The dimensions of the components of the second circuit board 20 preferably have the following relationship. The following structure can provide a high transmission performance while retaining the bendability.

As a first relationship, the width WSL of the first opening 29 is larger than a strip-line unopposed width W2, which is a width of half a portion of the ground conductor 231 not facing the signal conductor 221 (also applicable to a portion of the ground conductor 232 not facing the signal conductor 222). The unopposed width W2 is greater than the thickness D of the second circuit board 20. In other words, the relationship where (thickness D)<(strip-line unopposed width W2)<(width WSL of first opening 29) is satisfied. This structure can reduce electromagnetic field coupling between adjacent strip lines while the electromagnetic field distribution of the strip lines is stabilized.

As a second relationship, the width WSL of the first opening 29 is larger than the strip-line unopposed width W2. The strip-line unopposed width W2 is larger than the width W1 of the signal conductor 221 (also applicable to the signal conductor 222). The width W1 of the signal conductor is larger than the distance (interval) H between the signal conductor and the ground conductor in a strip line. In other words, the relationship where (distance H between signal conductor and ground conductor)<(width W1 of signal conductor)<(strip-line unopposed width W2)<(width WSL of first opening 29) is satisfied. This structure can reduce electromagnetic field coupling between adjacent strip lines while the electromagnetic field distribution of the strip lines is stabilized.

In the second circuit board 20, the thickness of the first portion, the thickness of the bent portion, and the thickness of the second portion are the same or substantially the same. In this case, the thickness indicates an average thickness, and may be a thickness other than a completely uniform thickness. However, the bent portion with a thickness smaller than the thickness of other portions is more easily bendable. The length of this thin portion in the first direction DIR1F matches the length of the first opening 29 in the first direction DIR1F. The thin portion and the first opening 29 may coincide with each other or may differ from each other in the first direction DIR1F. For example, the thin portion is shorter than the first opening 29, and disposed around a center portion of the first opening 29 in the first direction DIR1F. This structure facilitates bending of a portion around the center portion. Alternatively, thin portions are disposed at a portion of the first opening 29 adjacent to an edge portion where the main surface 101 and the side surface 103 of the first circuit board 10 cross each other, and at a portion of the first opening 29 adjacent to an edge portion where the main surface 102 and the side surface 103 of the first circuit board 10 cross each other. This structure facilitates bending of portions around the edge portions of the first circuit board 10.

Second Preferred Embodiment

Figure 5:
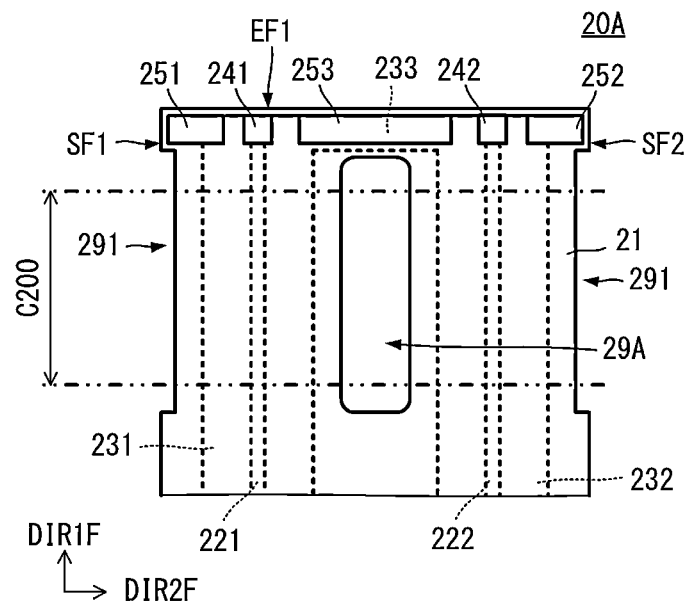
FIG. 5 is a plan view of a second circuit board of an electronic device according to a second preferred embodiment of the present invention.

An electronic device according to a second preferred embodiment of the present invention will be described with reference to the drawings. FIG. 5 is a plan view of a second circuit board of the electronic device according to the second preferred embodiment.

As illustrated in FIG. 5, the electronic device according to the second preferred embodiment differs from the electronic device 90 according to the first preferred embodiment in the structure of a second circuit board 20A. Other components of the electronic device according to the second preferred embodiment are the same or substantially the same as those of the electronic device 90 according to the first preferred embodiment, and thus will not be described.

The second circuit board 20A differs from the second circuit board 20 according to the first preferred embodiment in that it includes a first opening 29A. Other components of the second circuit board 20A are the same or substantially the same as those of the second circuit board 20, and thus will not be described.

The first opening 29A has a shape obtained by rounding the corners of the first opening 29. In this shape, the length of the first opening 29A in the second direction DIR2F at the end in the first portion and the length of the first opening 29A in the second direction DIR2F at the end in the second portion are smaller than the length of the first opening 29A in the second direction DIR2F at the other portion.

Thus, the portion 21 occupies a larger area at these end portions, and accordingly these end portions are less easily broken. This structure includes no corners that can easily cause breakage, and does not cause breakage originating from the corners. Thus, the second circuit board 20 improves reliability. Such a rounded shape may be provided on only the first portion or the second portion. Particularly, this shape is effective for the first portion with a small length in the first direction DIR1F.

Third Preferred Embodiment

Figure 6:
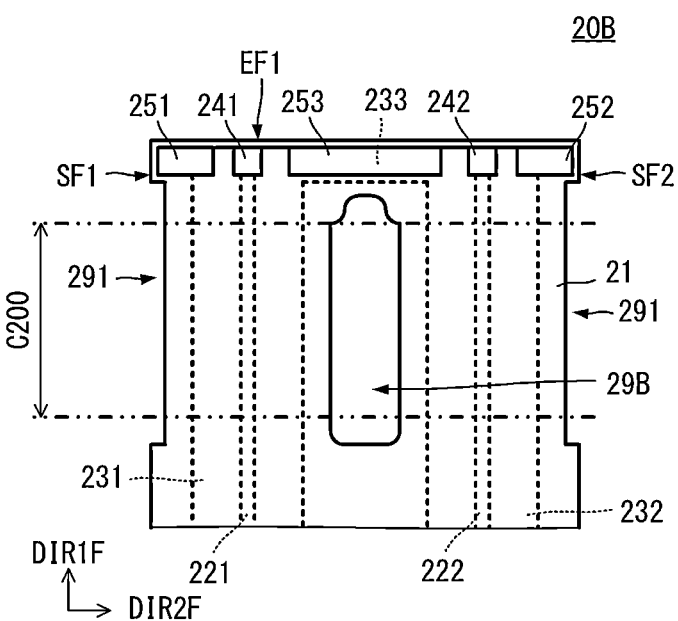
FIG. 6 is a plan view of a second circuit board of an electronic device according to a third preferred embodiment of the present invention.

An electronic device according to a third preferred embodiment of the present invention will be described with reference to the drawings. FIG. 6 is a plan view of a second circuit board of the electronic device according to the third preferred embodiment.

As illustrated in FIG. 6, the electronic device according to the third preferred embodiment differs from the electronic device according to the second preferred embodiment in the structure of a second circuit board 20B. Other components of the electronic device according to the third preferred embodiment are the same or substantially the same as those of the electronic device according to the second preferred embodiment, and thus will not be described.

The second circuit board 20B differs from the second circuit board 20A according to the second preferred embodiment in that it includes a first opening 29B. Other components of the second circuit board 20B are the same or substantially the same as those of the second circuit board 20A, and thus will not be described.

The length of the first opening 29B in the second direction DIR2F at a portion in the first portion is smaller than the length of the first opening 29B in the second direction DIR2F at another portion. This structure further prevents breakage of a portion closer to the end surface EF1 than the first opening 29B.

In this structure, the width of a portion of the first opening 29B that does not face the main surface 101 of the first circuit board 10 (a portion C200 in FIG. 6) is not small. Thus, the second circuit board 20B can retain bendability.

Fourth Preferred Embodiment

Figure 7:
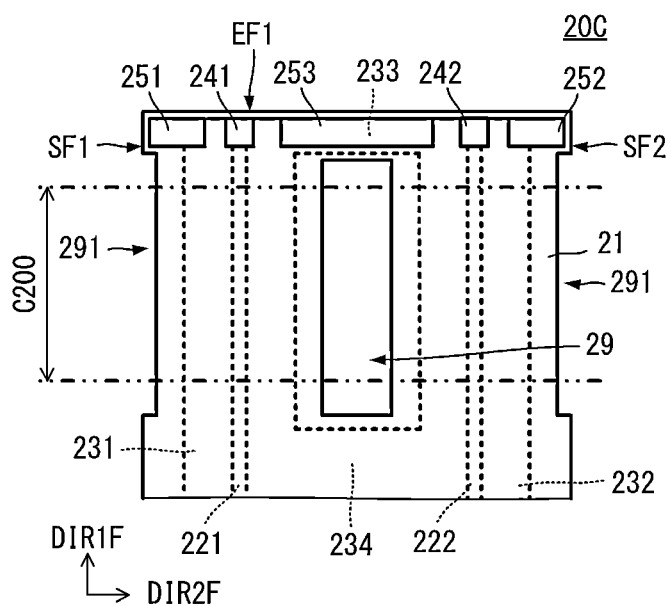
FIG. 7 is a plan view of a second circuit board of an electronic device according to a fourth preferred embodiment of the present invention.

An electronic device according to a fourth preferred embodiment of the present invention will be described with reference to the drawings. FIG. 7 is a plan view of a second circuit board of the electronic device according to the fourth preferred embodiment.

As illustrated in FIG. 7, the electronic device according to the fourth preferred embodiment differs from the electronic device 90 according to the first preferred embodiment in the structure of a second circuit board 20C. Other components of the electronic device according to the fourth preferred embodiment are the same or substantially the same as those of the electronic device 90 according to the first preferred embodiment, and thus will not be described.

The second circuit board 20C differs from the second circuit board 20 according to the first preferred embodiment in that it includes a ground conductor 234. Other components of the second circuit board 20C are the same or substantially the same as those of the second circuit board 20, and thus will not be described.

The ground conductor 234 is disposed at the second portion, that is, a portion located opposite to the portion where the end surface EF1 is disposed with the first opening 29 interposed therebetween. The ground conductor 234 is disposed between the ground conductors 231 and 232, and physically connected to the ground conductors 231 and 232.

The second circuit board 20C with this structure improves the strength of the second portion. Thus, the second circuit board 20C disposed on the main surface 102 of the first circuit board 10 can be easily retained.

Fifth Preferred Embodiment

Figure 8:
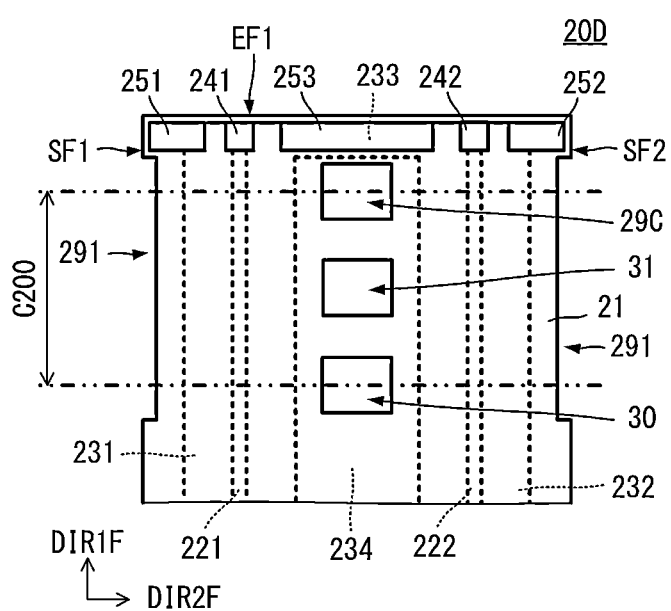
FIG. 8 is a plan view of a second circuit board of an electronic device according to a fifth preferred embodiment of the present invention.

An electronic device according to a fifth preferred embodiment of the present invention will be described with reference to the drawings. FIG. 8 is a plan view of a second circuit board of the electronic device according to the fifth preferred embodiment.

As illustrated in FIG. 8, the electronic device according to the fifth preferred embodiment differs from the electronic device 90 according to the first preferred embodiment in the structure of a second circuit board 20D. Other components of the electronic device according to the fifth preferred embodiment are the same or substantially the same as those of the electronic device 90 according to the first preferred embodiment, and thus will not be described.

The second circuit board 20D differs from the second circuit board 20 according to the first preferred embodiment in that it includes a first opening 29C, a second opening 30, and an auxiliary opening 31. Other components of the second circuit board 20D are the same or substantially the same as those of the second circuit board 20, and thus will not be described.

The first opening 29C extends from the first portion to the bent portion. The first opening 29C is not provided in the second portion.

When viewed in the third direction DIR3F, the second opening 30 is provided between the signal conductors 221 and 222. The second opening 30 extends from the second portion to the bent portion. However, the second opening 30 is not provided in the first portion. The second opening 30 is spaced apart from the first opening 29C in the first direction DIR1F. The second portion includes a portion not including the second opening 30 between the signal conductors 221 and 222.

When viewed in the third direction DIR3F, the auxiliary opening 31 is provided between the signal conductors 221 and 222. The auxiliary opening 31 overlaps the vertex of the bent portion. To this end, the auxiliary opening 31 is located around the center portion of the bent portion in the first direction DIR1F. The auxiliary opening 31 is disposed in neither the first portion nor the second portion.

The auxiliary opening 31 is spaced apart from the first opening 29C and the second opening 30 in the first direction DIR1F. In the present preferred embodiment, the auxiliary opening 31 is located between the first opening 29C and the second opening 30 in the first direction DIR1F. As described above, the second circuit board 20D includes multiple openings in the first direction DIR1F.

This structure has a smaller opening area, and can thus reduce unnecessary radiation of electromagnetic waves from the signal conductors 221 and 222 to the outside. In this structure, the first opening 29C, the second opening 30, and the auxiliary opening 31 overlap the bending points of the second circuit board 20D and the vertex of the bent portion of the second circuit board 20D. This structure thus facilitates bending of the second circuit board 20D.

In the second circuit board 20D, the second opening 30 may be provided at at least one of the second portion or the bent portion. The second circuit board 20D may include multiple openings in the second direction DIR2F. The second circuit board 20D may include at least one of the first opening 29C or the second opening 30. In the second circuit board 20D, the auxiliary opening 31 may be provided at a portion other than a portion around the center portion of the bent portion in the first direction DIR1F. The second circuit board 20D may eliminate the auxiliary opening 31.

Sixth Preferred Embodiment

Figure 9:
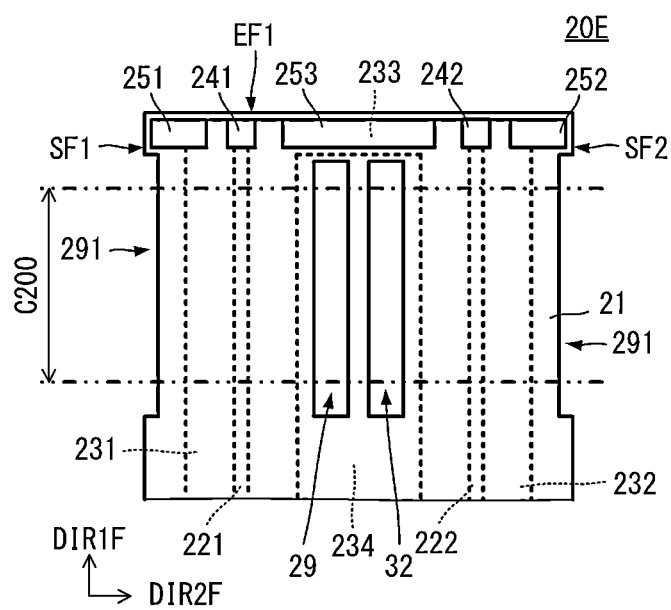
FIG. 9 is a plan view of a second circuit board of an electronic device according to a sixth preferred embodiment of the present invention.

An electronic device according to a sixth preferred embodiment of the present invention will be described with reference to the drawings. FIG. 9 is a plan view of a second circuit board of the electronic device according to the sixth preferred embodiment.

As illustrated in FIG. 9, the electronic device according to the sixth preferred embodiment differs from the electronic device 90 according to the first preferred embodiment in the structure of a second circuit board 20E. Other components of the electronic device according to the sixth preferred embodiment are the same or substantially the same as those of the electronic device 90 according to the first preferred embodiment, and thus will not be described.

The second circuit board 20E differs from the second circuit board 20 according to the first preferred embodiment in that it includes a third opening 32. Other components of the second circuit board 20E are the same or substantially the same as those of the second circuit board 20, and thus will not be described.

The first opening 29 extends from the first portion to the second portion through the bent portion.

When viewed in the third direction DIR3F, the third opening 32 is provided between the signal conductors 221 and 222. The third opening 32 extends from the first portion to the second portion through the bent portion. The third opening 32 is spaced apart from the first opening 29 in the second direction DIR2F. The first portion and the second portion each include a portion including neither the first opening 29 nor the third opening 32 between the signal conductors 221 and 222. As described above, the second circuit board 20E includes multiple openings in the second direction DIR2F.

Thus, the second circuit board 20E improves the strength at the portion including neither the first opening 29 nor the third opening 32. The second circuit board 20E thus facilitates bending while retaining its strength.

In the second circuit board 20E, the third opening 32 may extend from at least one of the first portion or the second portion to the bent portion. The second circuit board 20E may include multiple openings in the first direction DIR1F. In the second circuit board 20E, the first opening 29 may extend from at least one of the first portion or the second portion to the bent portion. The second circuit board 20E may include at least one of the second opening 30 or the auxiliary opening 31. In this case, the third opening 32 may be spaced apart from the first opening 29, the second opening 30, and the auxiliary opening 31 in the second direction DIR2F.

In the above description, in the first circuit board 10, the length L12 in the second direction DIR2 is larger than the length L11 in the first direction DIR1. However, the length L12 and the length L11 may be the same or substantially the same, or the length L11 may be larger than the length L12. However, when, as in the above description, the length L12 is larger than the length L11 and the second circuit board 20 extends in the second direction DIR2 of the first circuit board 10, the bent portion has a large width. In such a case, the above-described structure retains bendability, and is thus effective.

In each of the above-described preferred embodiments, the first opening extends from the first portion to the second portion through the bent portion, or from the first portion to the bent portion. However, the first opening may extend from the second portion to the bent portion.

In each of the above-described preferred embodiments, the second circuit board includes the recesses 291 in the side surfaces SF1 and SF2 in a portion including the first opening in the first direction DIR1F. However, the second circuit board may include no recesses 291.

Each of the above-described preferred embodiments includes two signal conductors. However, preferred embodiments of the present invention are applicable to a structure including three or more signal conductors. In this case, the structure only has to include a first opening between at least one pair of signal conductors adjacent to each other. The structure may include first openings between all of the pairs of signal conductors adjacent to each other.

In each of the above-described preferred embodiments, a second circuit board includes a micro-strip line as a strip line. However, the second circuit board may include a tri-plate strip line, for example. This structure may also include the above components as appropriate. In this case, preferably, via conductors that connect the ground conductors disposed to hold the signal conductor are not disposed at the bent portion. This structure can prevent disconnection between the via conductors and the ground conductors due to bending.

Instead of indicating a strict parallel state or a strict orthogonal state, the term "parallel" or "orthogonal" described in each of the above preferred embodiments includes a state within manufacturing tolerance in addition to the strict parallel state or the strict orthogonal state.

Components, features, portions, etc., of the above-described preferred embodiments can be combined as appropriate, and each combination can achieve the advantageous operational effects described above.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic device, comprising:
a first circuit board including a first main surface and a second main surface opposite to each other; and
a second circuit board including a first portion facing the first main surface, a second portion facing the second main surface, and a bent portion connecting the first portion and the second portion to each other; wherein
the second circuit board includes:
a circuit portion defining the first portion, the bent portion, and the second portion and having insulating properties;
a plurality of signal conductors on the circuit portion, extending in a first direction in which the first portion, the bent portion, and the second portion are connected, and being spaced apart from each other in a second direction orthogonal or substantially orthogonal to the first direction; and a first opening between the plurality of signal conductors when viewed in a thickness direction of the circuit portion;

the first opening extends from at least one of the first portion or the second portion to the bent portion;

the first portion and the second portion each include a portion not including the first opening between the plurality of signal conductors; and the circuit portion included in the second circuit board has a relative permittivity lower than a relative permittivity of a circuit portion included in the first circuit board and having insulating properties.

2. The electronic device according to claim 1, wherein the bent portion has a thickness smaller than a thickness of the first portion and a thickness of the second portion.

3. The electronic device according to claim 1, wherein a length of the first opening in the second direction at an end portion in the first portion is smaller than a length of the first opening in the second direction at another portion.

4. The electronic device according to claim 1, wherein a length of the first opening in the second direction at the bent portion is larger than a length of the first opening in the second direction at portions overlapping the first portion and the second portion.

5. The electronic device according to claim 1, wherein the first circuit board has a length in the second direction larger than a length in the first direction.

6. The electronic device according to claim 1, wherein
the first opening extends from the first portion to the second portion through the bent portion; and
the first opening continuously extends in the first direction between both ends of the bent portion.

7. The electronic device according to claim 1, wherein
the second circuit board includes a second opening between the plurality of signal conductors when viewed in the thickness direction of the circuit portion of the second circuit board;
the second opening is in at least one of the second portion or the bent portion;
the second opening is spaced apart from the first opening in the first direction; and
the second portion includes a portion not including the second opening between the plurality of signal conductors.

8. The electronic device according to claim 7, wherein
the first opening extends from the first portion to the bent portion; and
the second opening extends from the second portion to the bent portion.

9. The electronic device according to claim 1, wherein
the second circuit board includes a third opening between the plurality of signal conductors when viewed in the thickness direction of the circuit portion of the second circuit board;
the third opening extends from at least one of the first portion or the second portion to the bent portion;
the third opening is spaced apart from the first opening in the second direction; and
the first portion and the second portion each include a portion not including the third opening between the plurality of signal conductors.

10. An electronic device, comprising:
a first circuit board including a first main surface and a second main surface opposite to each other; and
a second circuit board including a first portion facing the first main surface, a second portion facing the second main surface, and a bent portion connecting the first portion and the second portion to each other; wherein
the second circuit board includes:
a circuit portion defining the first portion, the bent portion, and the second portion and having insulating properties;
a plurality of signal conductors on the circuit portion, extending in a first direction in which the first portion, the bent portion, and the second portion are connected, and being spaced apart from each other in a second direction orthogonal or substantially orthogonal to the first direction; and
a first opening between the plurality of signal conductors when viewed in a thickness direction of the circuit portion;
the first opening extends from at least one of the first portion or the second portion to the bent portion;
the first portion and the second portion each include a portion not including the first opening between the plurality of signal conductors;
the second circuit board includes a planar ground conductor on the circuit portion of the second circuit board, facing the plurality of signal conductors, and spaced apart from the plurality of signal conductors in the thickness direction of the circuit portion; and
the second circuit board has a strip line structure.

11. The electronic device according to claim 10, wherein the plurality of signal conductors in the second circuit board are located closer to the first circuit board than the ground conductor.

12. The electronic device according to claim 10, wherein
the second circuit board includes, at the first portion, a plurality of external connection conductors respectively connected to the plurality of signal conductors; and
the plurality of external connection conductors are located at a portion of the first portion not including the first opening.

13. The electronic device according to claim 12, wherein the ground conductor is located at the portion of the first portion not including the first opening.

14. The electronic device according to claim 13, wherein the ground conductor at the portion of the first portion not including the first opening has a length in the second direction that is larger than a length of the first opening in the second direction.

15. The electronic device according to claim 13, further comprising:
an external connection conductor between the plurality of signal conductors, the external connection conductor being connected to the ground conductor at the portion of the first portion not including the first opening; and
the external connection conductor between the plurality of signal conductors has a length in the second direction larger than a length of the first opening in the second direction.

16. The electronic device according to claim 10, wherein
a length of the first opening in the second direction is larger than an unopposed width of a portion where the plurality of signal conductors and the ground conductor do not face each other;
the unopposed width is larger than a width of the plurality of signal conductors; and the width of the plurality of signal conductors is larger than a distance between the plurality of signal conductors and the ground conductor.

17. The electronic device according to claim 10, wherein
a length of the first opening in the second direction is larger than an unopposed width of a portion where the plurality of signal conductors and the ground conductor do not face each other; and
the unopposed width is larger than a thickness of the circuit portion of the second circuit board.

18. An electronic device, comprising:
a first circuit board including a first main surface and a second main surface opposite to each other; and
a second circuit board including a first portion facing the first main surface, a second portion facing the second main surface, and a bent portion connecting the first portion and the second portion to each other; wherein
the second circuit board includes:
  a circuit portion defining the first portion, the bent portion, and the second portion and having insulating properties;
  a plurality of signal conductors on the circuit portion, extending in a first direction in which the first portion, the bent portion, and the second portion are connected, and being spaced apart from each other in a second direction orthogonal or substantially orthogonal to the first direction; and
  a first opening between the plurality of signal conductors when viewed in a thickness direction of the circuit portion;
the first opening extends from at least one of the first portion or the second portion to the bent portion;
the first portion and the second portion each include a portion not including the first opening between the plurality of signal conductors; and
the circuit portion included in the second circuit board has a dielectric loss tangent lower than a dielectric loss tangent of a circuit portion included in the first circuit board.

19. An electronic device, comprising:
a first circuit board including a first main surface and a second main surface opposite to each other; and
a second circuit board including a first portion facing the first main surface, a second portion facing the second main surface, and a bent portion connecting the first portion and the second portion to each other; wherein
the second circuit board includes:
  a circuit portion defining the first portion, the bent portion, and the second portion and having insulating properties;
  a plurality of signal conductors on the circuit portion, extending in a first direction in which the first portion, the bent portion, and the second portion are connected, and being spaced apart from each other in a second direction orthogonal or substantially orthogonal to the first direction; and
  a first opening between the plurality of signal conductors when viewed in a thickness direction of the circuit portion;
the first opening extends from at least one of the first portion or the second portion to the bent portion;
the first portion and the second portion each include a portion not including the first opening between the plurality of signal conductors;
a planar antenna conductor is located on the first main surface of the first circuit board; and
the second circuit board is connected to the planar antenna conductor.

20. An electronic device, comprising:
a first circuit board including a first main surface and a second main surface opposite to each other; and
a second circuit board including a first portion facing the first main surface, a second portion facing the second main surface, and a bent portion connecting the first portion and the second portion to each other; wherein
the second circuit board includes:
  a circuit portion defining the first portion, the bent portion, and the second portion and having insulating properties;
  a plurality of signal conductors on the circuit portion, extending in a first direction in which the first portion, the bent portion, and the second portion are connected, and being spaced apart from each other in a second direction orthogonal or substantially orthogonal to the first direction; and
  a first opening between the plurality of signal conductors when viewed in a thickness direction of the circuit portion;
the first opening extends from at least one of the first portion or the second portion to the bent portion;
the first portion and the second portion each include a portion not including the first opening between the plurality of signal conductors;
the second circuit board includes an auxiliary opening between the plurality of signal conductors when viewed in the thickness direction of the circuit portion of the second circuit board;
the auxiliary opening overlaps a vertex of the bent portion; and
the auxiliary opening is spaced apart from the first opening and the second opening in the first direction.

* * * * *